(12) United States Patent  
Jefferson

(10) Patent No.: US 6,326,812 B1  
(45) Date of Patent: Dec. 4, 2001

(54) PROGRAMMABLE LOGIC DEVICE WITH LOGIC SIGNAL DELAY COMPENSATED CLOCK NETWORK

(75) Inventor: David Jefferson, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/625,439

(22) Filed: Jul. 26, 2000

Related U.S. Application Data

(63) Continuation of application No. 09/084,468, filed on May 26, 1998, now Pat. No. 6,127,865
(60) Provisional application No. 60/047,624, filed on May 23, 1997.

(51) Int. Cl.[7] .................................................... G06F 1/10
(52) U.S. Cl. .............................. 326/93; 327/149; 327/158
(58) Field of Search ..................................... 327/141, 144, 327/146–150, 156–159, 161, 292, 295; 326/93, 101

(56) References Cited

U.S. PATENT DOCUMENTS

| | | | |
|---|---|---|---|
| 4,839,604 | 6/1989 | Tanahashi | 327/295 |
| 5,133,064 | 7/1992 | Hotta et al. | 327/156 |
| 5,550,782 | 8/1996 | Cliff et al. | 365/230.03 |
| 5,550,783 | 8/1996 | Stephens, Jr. et al. | 365/233 |
| 5,578,945 | 11/1996 | Flora | 327/156 |
| 5,668,504 | 9/1997 | Ramalho | 327/147 |

OTHER PUBLICATIONS

Altera Corp., 1996 Data Book, A–DB–0696–01, 6/96.
Chen, Dao–Long, "Designing On–Chip Clock Generators", 1992, IEEE Circuits and Devices, pp. 32–36, 7/92.
Gardner, F., Phase Accuracy of Charge Pump PLL's IEEE Transactions on Communications, vol. Com–30, No. 10, pp. 2362–2363, 10/82.
Steinke, G., "Using PLL Technology In a Programmable Logic Device", Electronic Design, pp. 123–134, Jul. 7, 1997.

*Primary Examiner*—Tuan T. Lam
(74) *Attorney, Agent, or Firm*—Morrison & Foerster LLP

(57) ABSTRACT

An integrated circuit programmable logic device comprising: a plurality of programmable logic elements that are responsive to clock signals; a clock signal generation circuit which produces a first clock signal; a first phase shifting element which produces a second clock signal which is a phase-shifted version of the first clock signal, shifted in phase by an amount which compensates for a logic signal delay; and a clock signal distribution network which distributes the first and second clock signals among the programmable logic elements.

16 Claims, 14 Drawing Sheets

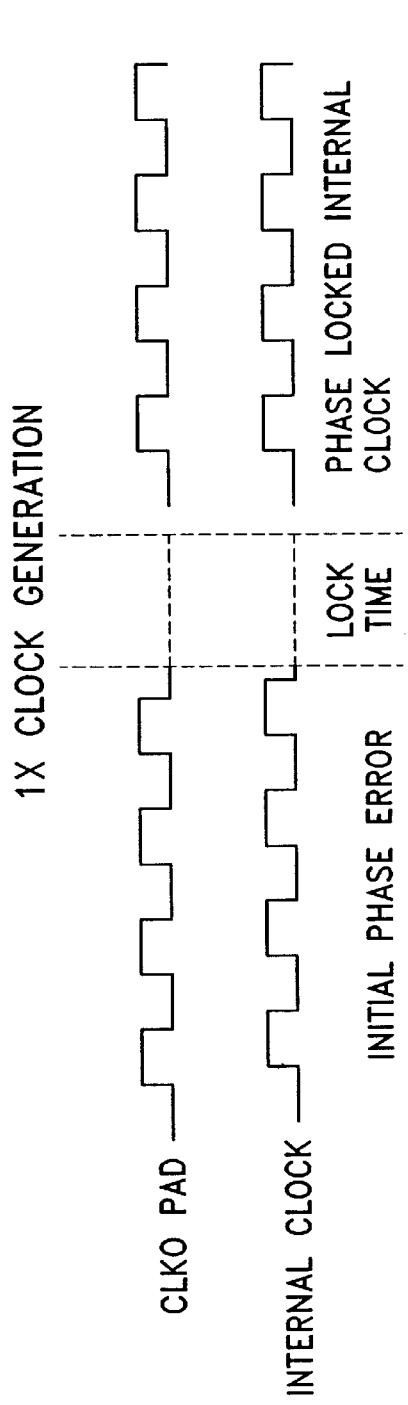
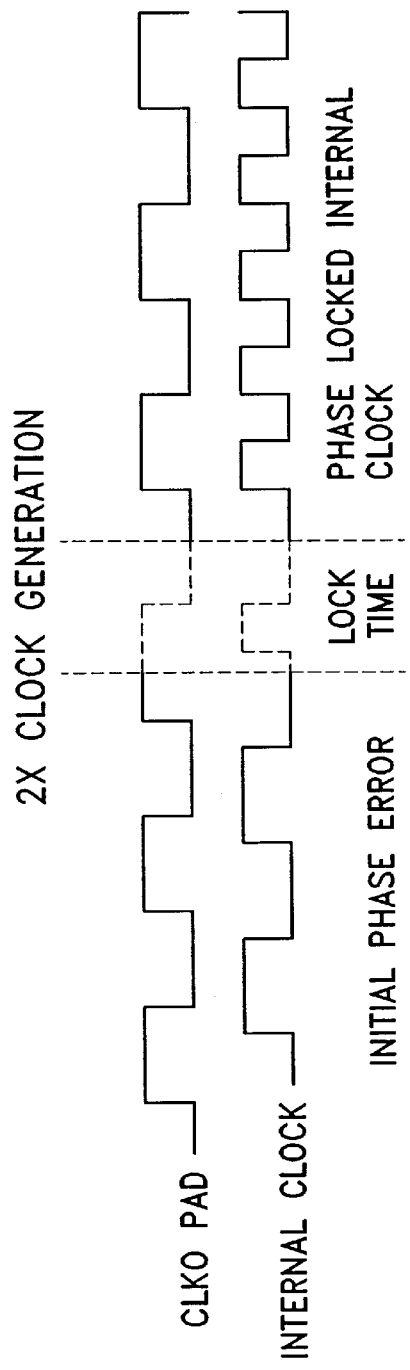

PROGRAMMABLE LOGIC DEVICE WITH LOGIC SIGNAL DELAY COMPENSATED CLOCK NETWORK

This application is a continuation of U.S. application Ser. No. 09/084,468, filed May 26, 1998, now U.S. Pat. No. 6,127,865 which claims benefit of the provisional application 60/047,624 filed May 23, 1997.

BACKGROUND OF THE INVENTION

1. Field of the Invention

The invention relates in general to integrated circuits and more particularly to the distribution of clock signals in programmable logic devices.

2. Description of the Related Art

A programmable logic device (PLD) integrated circuit comprises an array of functional blocks along with an interconnection network. The specific function of each block and the connections between blocks can be programmed by the user. For example, a typical PLD generally includes a control store in the form of a static random access memory array (SRAM), for instance, and includes functional units and interconnect wires that are programmed by writing to the control store to establish specific logic gates, storage elements and interconnect paths.

As PLDs increase in logic density, clock distribution delay becomes an increasingly significant fraction of the clock period. This clock distribution delay can impact device performance by degrading setup, hold and clock-to-output parameters, for example. Moreover, race conditions between clocks and data can result in race-through problems if proper clock planning techniques are not applied. A typical PLD often provides a variety of alternative clock sources. A PLD register, for instance, may be programmable to receive a clock signal from any of multiple different clock sources. Clock tree networks have been used to model clock delays around PLDs in order to reduce clock skew problems. Specifically, delays may be added to clock nets that have shorter clock paths so that they will match the delays experienced by the larger clock nets. This approach has been used to equalize the clock delays in such earlier PLDs.

Phase lock loop (PLL) circuits have been added to PLDs to generate clock signals with minimal clock skew and delay problems and improved setup and clock-to-output times. For instance, a PLL circuit may be coupled to receive an external reference clock signal applied to a clock pad of the PLD and to produce a duplicate version of the reference clock signal (same frequency) which is earlier in phase relative to the reference clock signal. This has been achieved by tapping a delay element in the feedback path of the PLL circuit so as to provide a PLL clock signal which is an early version of the external reference clock signal.

PLDs have been implemented in which a PLL has such a delay network in its feedback path that models the PLD clock tree so as to track over process, temperature and voltage to provide a consistent clock skew with respect to the reference clock. Such a delay network causes the PLL to generate an early clock that is ahead of the reference clock by an amount that compensates for the delay of the clock network. In this manner, chip clock skew can be canceled, and local clock drivers that propagate the PLL early clock can have relatively little clock skew with respect to the reference clock signal.

The drawing of FIG. 1 is a generalized schematic block diagram which shows a clock distribution network 20 employed in an earlier FLEX 10K programmable logic device which is presented merely as an illustrative example of the related art. Details of the FLEX 10K PLD can be found in the Altera 1996 Data Book produced by the Altera Corporation of San Jose Calif. The clock distribution network of the PLD includes a clock pad 22 which receives an external clock signal. The reference clock signal is distributed about the device by a reference clock conductor path 24. The clock distribution network also includes a phase lock loop 26 which receives the reference clock signal via a driver circuit 28 and has a clock network delay compensation circuit in its feedback path which is tapped to produce an early (or leading) version of the reference clock signal which shall be referred to as the early PLL clock signal. The early PLL clock signal is distributed about the device by a PLL clock conductor path 30. The clock distribution network is divided into six localized sections. Four sections 32-1, 32-2, 32-3 and 32-4 provide clock signals to registers in the PLD periphery which latch data on external input/output pads (not shown). Two sections 34-1 and 34-2 provide clock signals to registers in the PLD core (details not shown) which is programmable to build logic functions. The clock network is constructed so that the delays remain substantially constant regardless of the manner in which the periphery and the core are programmed.

Each of the respective six sections of the clock distribution network 20 shown in FIG. 1 includes a respective clock selection circuit 38 which receives as inputs the reference clock signal and the early PLL clock signal. The reference clock signal is conducted along the reference clock conductor path and is provided to respective selection circuits via respective driver circuits. The early PLL clock signal is conducted along the early PLL clock conductor path 24 and is provided to respective selection circuits via respective local delay elements 40 which may be programmable.

The local delay elements, which are part of the clock distribution network, are balanced so that all of the respective selection circuits receive PLL clock signals that are in phase with each other and that are in phase with the reference clock signal received on the external pad. A larger local delay d1 is produced by the delay local elements 40 that are closer to the reference clock pad and the PLL since the distance traveled by the early PLL clock signal is shorter. Conversely, a shorter local delay d3 is produced by the local delay elements 44 that are farther from the reference clock pad and the PLL since the distance traveled by the early PLL clock signal is longer. Thus, the local delays impart different delay amounts at different locations in the clock signal distribution network so as to balance out or compensate for differences in clock signal delay experienced at different portions of the PLD. As a result, the early PLL clock signal is received at substantially the same phase by all six clock selection circuits.

While earlier clock signal distribution networks in PLDs generally have been acceptable, there have been problems with their use. For example, there may be situations in which a PLD is programmed so that registers that temporarily store logic signals are separated by long line delays or by delays due to combinatorial logic. More specifically, in a PLD programmed for synchronous operation, the total register-to-register delay is approximately the sum of register clock-to-output time plus line delay between registers plus register setup time. The PLD clock generally cannot be run faster than the register-to-register delay. Thus, when logic signals in a PLD must be conducted along relatively long paths between registers or along paths between registers that are delayed by combinatorial logic, then the register-to-register delay may have a significant impact on device performance.

Thus, there exists a need for a programmable logic device with a clock signal network that can more effectively manage register-to-register delays experienced by logic signals. The present invention meets this need.

SUMMARY OF THE INVENTION

In one aspect, the present invention provides an integrated circuit programmable logic device with a plurality of programmable logic elements that are responsive to clock signals. A clock signal generation circuit produces a first clock signal. A first phase shifting element produces a second clock signal which is a phase-shifted version of the first clock signal, shifted in phase by an amount which compensates for a logic signal delay. A clock signal distribution network distributes the first and second clock signals among the programmable logic elements.

In another aspect, the present invention provides a method of propagating logic signals in an integrated circuit programmable logic device which comprises a plurality of programmable logic elements. The programmable logic elements are programmed such that a logic output of at least one respective programmable logic element is operably connected to a logic input of another respective programmable logic element. A first clock signal is provided. A second clock signal also is provided which is a phase-shifted version of the first clock signal, shifted in phase by an amount which compensates for a logic signal delay. Each of the multiple clock signals is distributed to the respective programmable logic elements. Respective storage elements of the respective programmable logic elements are programmed to receive one or another of the first and second clock signals. The respective storage elements are clocked or triggered by the respective received clock signals. As a result, logic signals are conducted between respective operably connected programmable logic elements.

Therefore, the invention advantageously permits programmable logic elements to be connected to receive either a first clock signal or a second clock signal which is a phase shifted version of the first clock signal. Different ones of these clock signals can be connected to different programmable logic elements to optimize overall performance of the programmable logic device. These and other features and advantages of the invention will be appreciated from the following detailed description in conjunction with the drawings.

BRIEF DESCRIPTION OF THE DRAWINGS

FIGS. 8A and 8B are exemplary timing diagrams showing external clock signals and related PLL-generated 1× clock signals (FIG. 8A) and PLL-generated 2× clock signals (FIG. 8B) using the PLL of FIG. 3.

DETAILED DESCRIPTION OF THE PREFERRED EMBODIMENTS

The present invention comprises a novel programmable logic device integrated circuit with a time-shifted clock network and associated method. The following description is presented to enable any person skilled in the art to make and use the invention. Descriptions of specific applications are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

A present embodiment of the invention advantageously provides a programmable logic device in which programmable logic elements can be programmed to receive either of two clock signals which have substantially the same frequency and which have a prescribed phase difference. The PLD can be programmed so as to minimize the impact on device performance due to the transmission of logic signals between logic storage elements separated by long line delays or by delays due to combinatorial logic. For example, the device can be programmed so that a storage element that outputs a logic signal that must traverse a relatively long path or a path delayed by combinatorial logic is clocked by an earlier phase clock than a storage element that receives a corresponding logic signal on the other end of the path. In effect, in this example, the outputting storage element would be clocked early in order to give the logic signal a head start so as to provide extra time to traverse the delayed path before the receiving storage element is clocked by the next clock pulse of the lagging phase clock.

Figure 2:
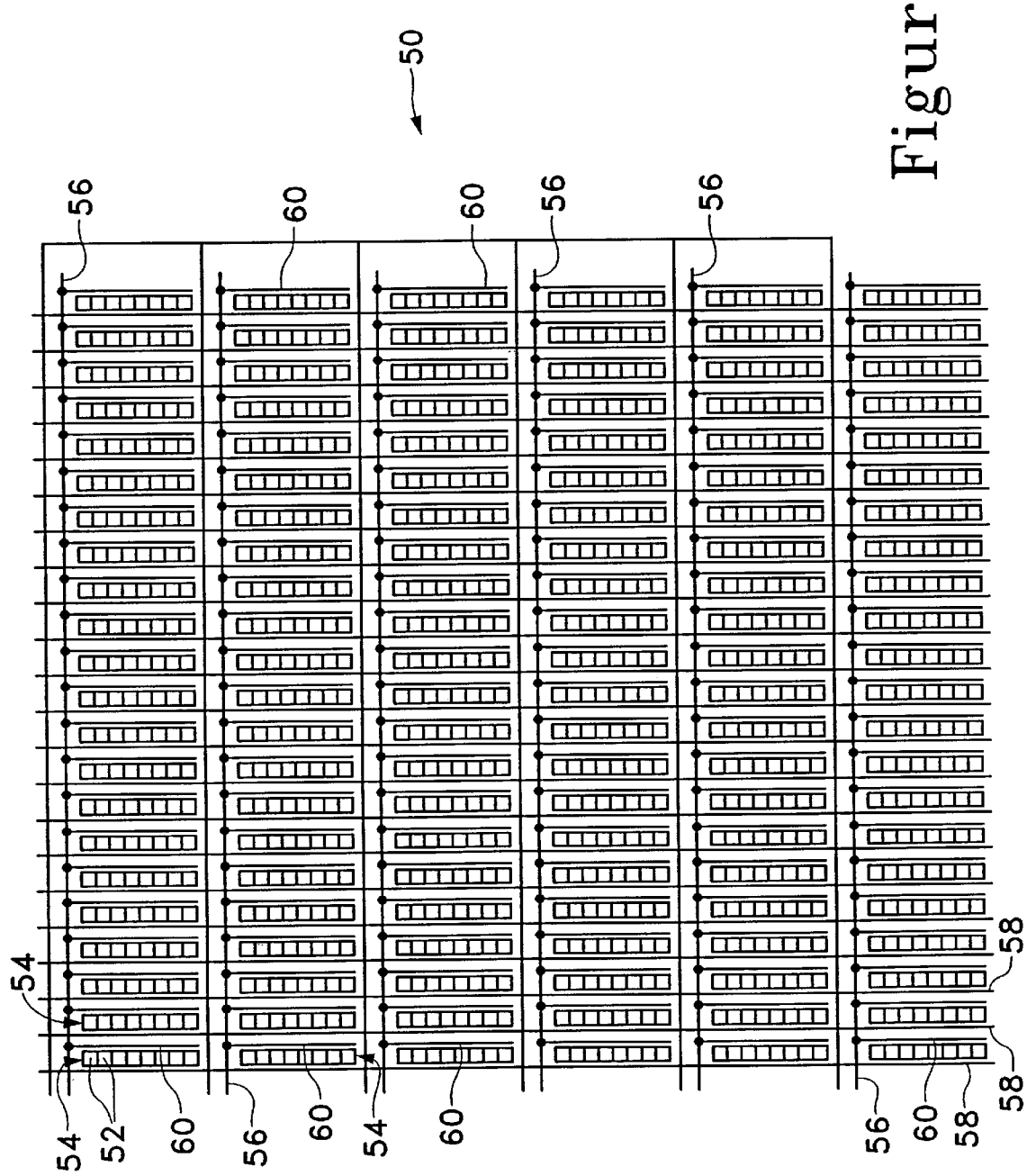
FIG. 2 is an illustrative block diagram of an arrangement of programmable logic elements in a programmable logic device of a presently preferred embodiment of the invention.

FIG. 2 is a generalized schematic block diagram of a portion of a programmable logic device (PLD) integrated circuit 50 which illustrates an exemplary array of programmable logic elements consistent with a present embodiment of the invention. Each programmable logic element 52 can perform a relatively simple logic function (e.g., form any logical combination of four inputs). In a present embodiment, groups of eight logic elements are combined in a programmable logic module (referred to herein as a logic array block, or LAB). LABs 54 are arranged in the circuit 50 in a two dimensional array of columns and rows. In one embodiment, the array of LABs comprises six rows of twenty-two LABs per row (or twenty-two columns of six LABs per column).

A group of global horizontal conductors 56 is associated with each row of LABs 54. A group of global vertical conductors 58 is associated with each column of LABs 54. A group of local vertical interface conductors 60 is associated with each LAB 54. A signal on any of the horizontal conductors 56 can be programmably applied (via local interface conductors 60) to one or more logic elements 52 in the LAB row associated with that conductor. The output signal of each logic element 52 can be programmably applied to a global horizontal conductor 56 associated with that element's LAB row, and also to one or two global vertical conductors 58 associated with that element's LAB column. The output of each logic element 52 can also be programmably applied to other logic elements in that element's LAB via local feedback conductors. The global vertical conductors 58 are programmably connectable to the global horizontal conductors 56.

The conductors and connections described above comprise an interconnection network of the programmable logic device 50 of the presently preferred embodiment of the invention. This general interconnection network permits logic signals output by any logic module (LAB) to be provided as input to virtually any other logic module so that the circuit 50 can be programmed to perform large numbers of logic functions of almost any desire complexity. Although the present invention shall be explained in terms of its application to programmable logic device (PLD) integrated circuits of the general type shown in commonly assigned U.S. Pat. No. 5,550,782, which is hereby incorporated by reference, it will be appreciated that the invention can be practiced in the context of other types of programmable devices.

Phase Lock Loop in General

Figure 3:
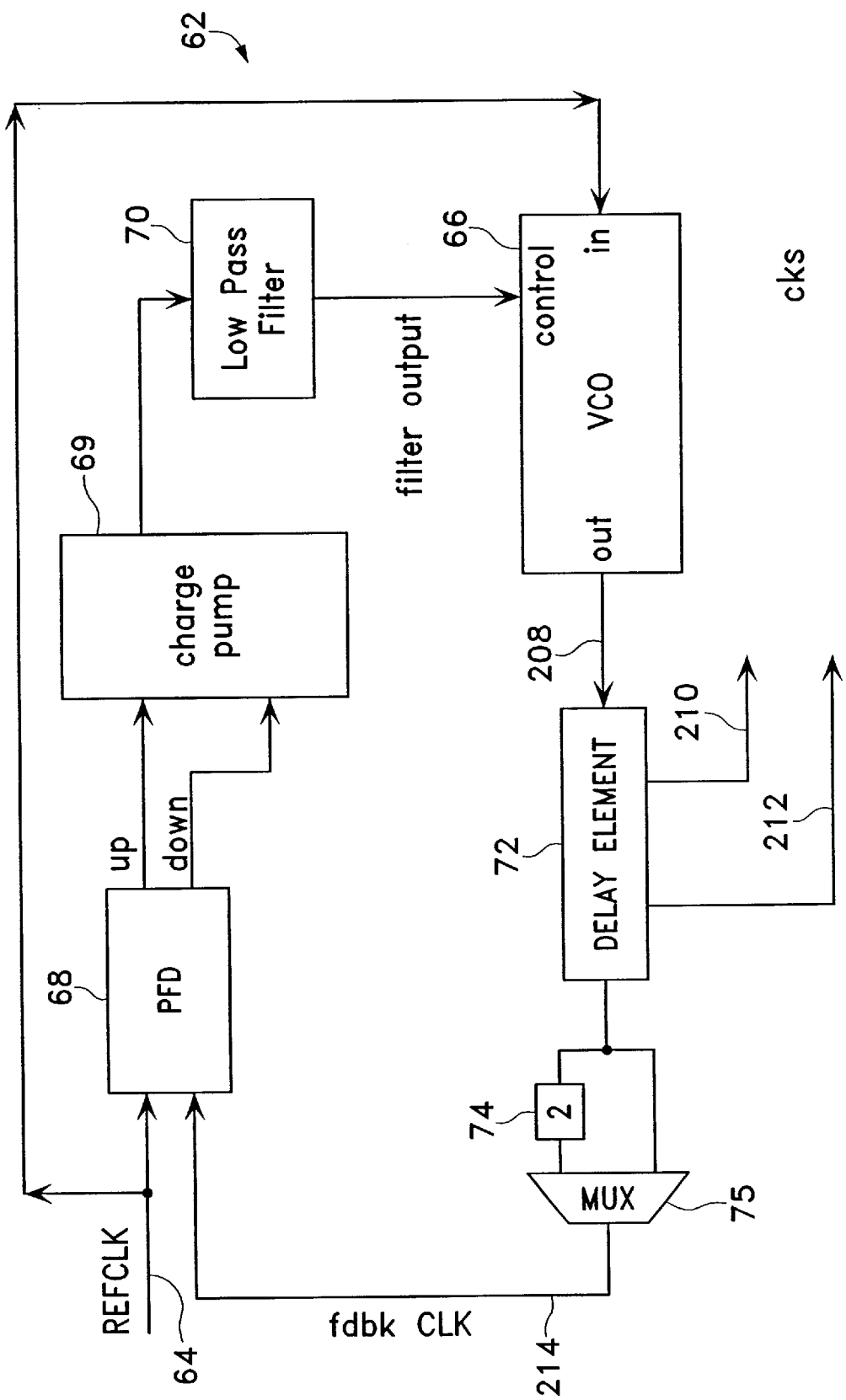
FIG. 3 is an illustrative block diagram of a phase lock loop (PLL) of the embodiment of FIG. 2.

The illustrative drawings of FIG. 3 is a block diagram of a PLL 62 which generates clock signals accordance with a presently preferred embodiment of the invention. In operation, the PLL 62 duplicates an externally generated periodic signal at the CLK pad 64 and produces a clock signal delay compensated clock signal on line 212 and a logic signal delay compensated clock signal on line 210. When the PLL is locked on an incoming periodic signal, the frequency of the Voltage Controlled Oscillator (VCO) 66 is the same as that of the external clock input on CLK pad 64. This is true, unless of course, the PLL is being used for clock multiplication. In the case of clock multiplication, the VCO 66 generates a signal that has a frequency which is a multiple of the CLK pad frequency. In the case of clock multiplication, a feedback signal in the PLL feedback loop is divided down to match the frequency of the external clock received at the CLK pad 64 so the loop can obtain lock. Of course, in the case of clock multiplication, the on-chip clock signals on lines 212 and 210 are a multiple of the CLK pad frequency.

The elements of the PLL system 62 include a phase frequency detector (PFD) 68, a charge pump, a phase lag low pass filter 70, low gain VCO 66, a delay network 72 and a divide-by-two circuit 74 that is used in clock multiplication and an associated multiplexer 75 used to select the direct output or divided down output of the delay element 72. The output of the multiplexer 75 is provided to the PFD 68. This general type of PLL system has extremely accurate phase tracking capability as well as a low sensitivity to noise. This can be importance since, for example, a PLD with a 100K density range often can generate greater than 10 watts switching power which requires the PLL to have a very high noise immunity.

Phase Frequency Detector

Figure 4:
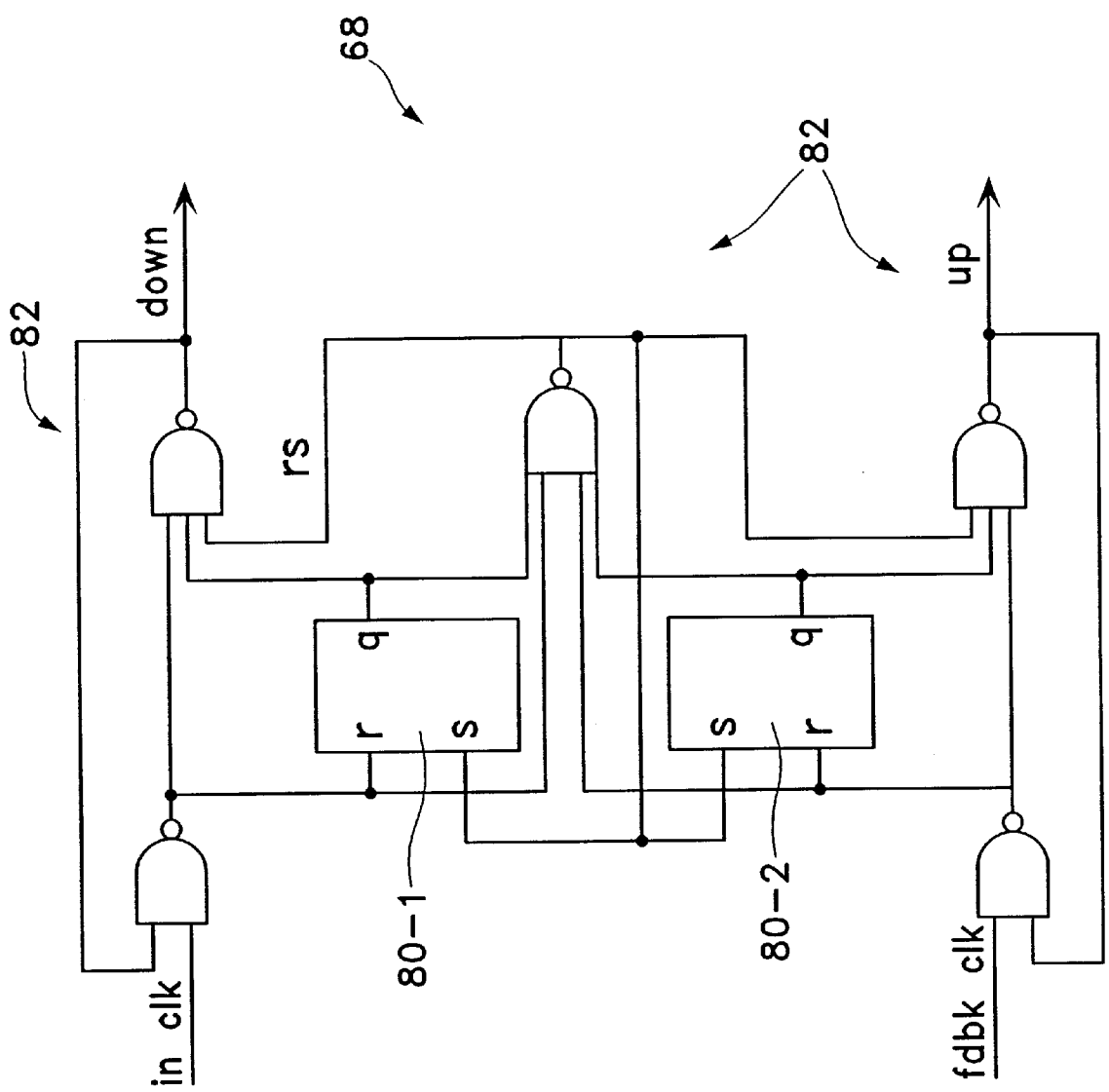
FIG. 4 is an illustrative drawing of a phase frequency detector circuit used in the PLL of FIG. 3.

The illustrative drawing of FIG. 4 shows a well known PFD circuit 68 used in the PLL 62 of FIG. 3. The PFD 68 includes two RS Flip Flops 80-1 and 80-2 and associated logic gates 82 connected as shown. This general type of PFD offers a substantially unlimited pull-in range and will not false lock on second or third harmonics, which assures that the PLL will attain a locked state within the frequency range of the VCO 66. Moreover, PFD type of phase detector is well suited to use with a charge pump PLL.

Phase Latched Charge Pump

Figure 5:
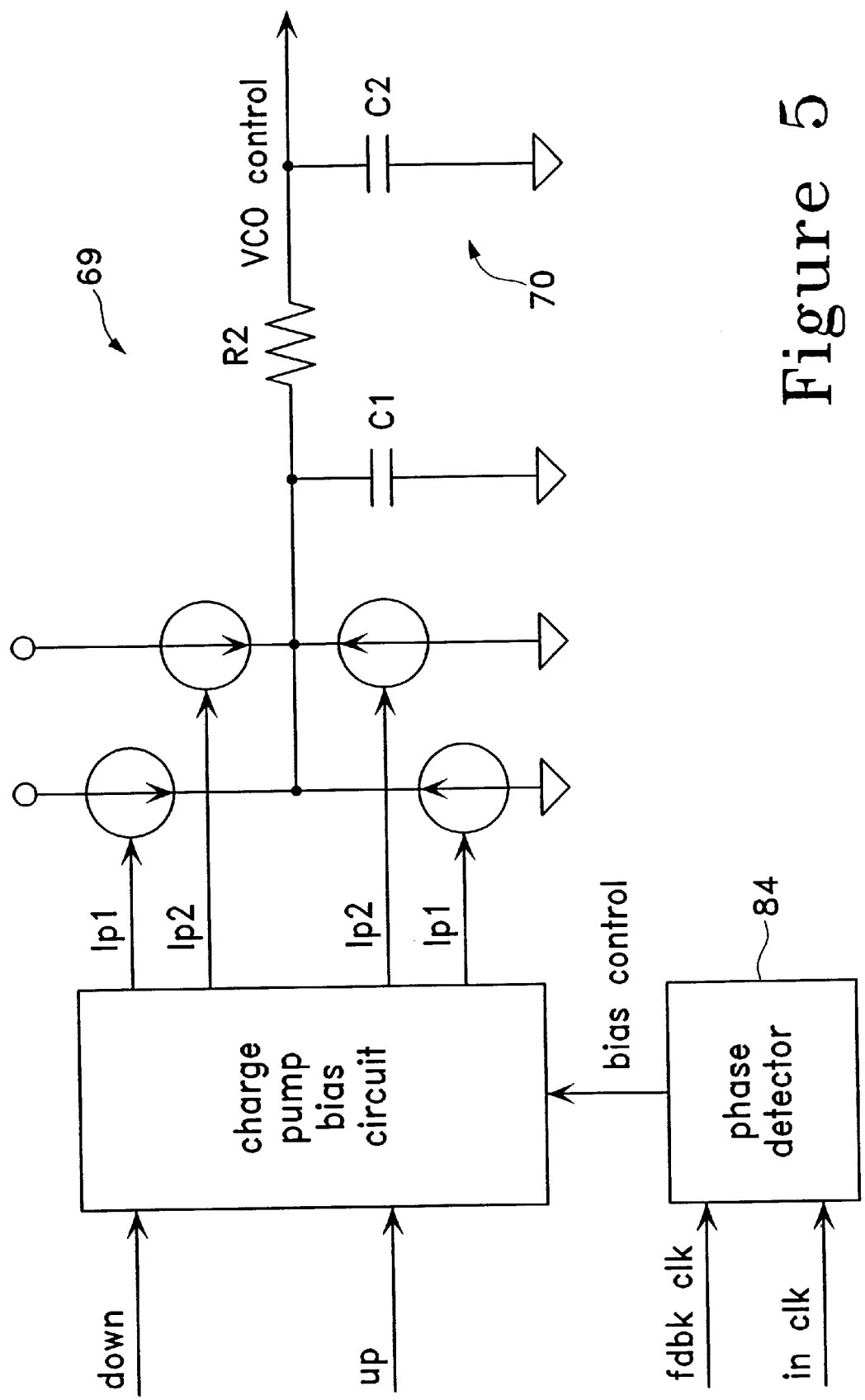
FIG. 5 is an illustrative block diagram of a phase latched charge pump circuit and a passive lag low pass filter used in the PLL of FIG. 3.

Charge pump PLLs are capable of very accurate phase tracking. See, F. Gardner, "Phase Accuracy of Charge Pump PLLs," IEEE Transactions on Communications, Vol. Com-30, No. 10, October 1982. FIG. 5 shows a block diagram of a phase latched charge pump circuit 69 and a passive lag low pass filter 70 used in the PLL of FIG. 3. The phase latched charge pump 69 delivers +/− Ip1 ua, or 0 ua (tristate) of current into the low pass filter 70. Once the PLL 62 has attained lock then the charge pump is tristated. In general the charge pump current should be controlled precisely or the PLL 62 may never attain the lock condition.

Passive Lag Low Pass Filter

Referring again to FIG. 5, the passive lag low pass filter 70 includes a resistor/capacitor network. The purpose of the low pass filter 70 is to filter out higher frequency components. It also provides a memory for the PLL 62 if the lock is momentarily lost. The low pass filter has a strong influence on the stability of the PLL. Specifically, it effects the damping coefficient of the PLL.

Programmable VCO And Noise Management

Figure 6:
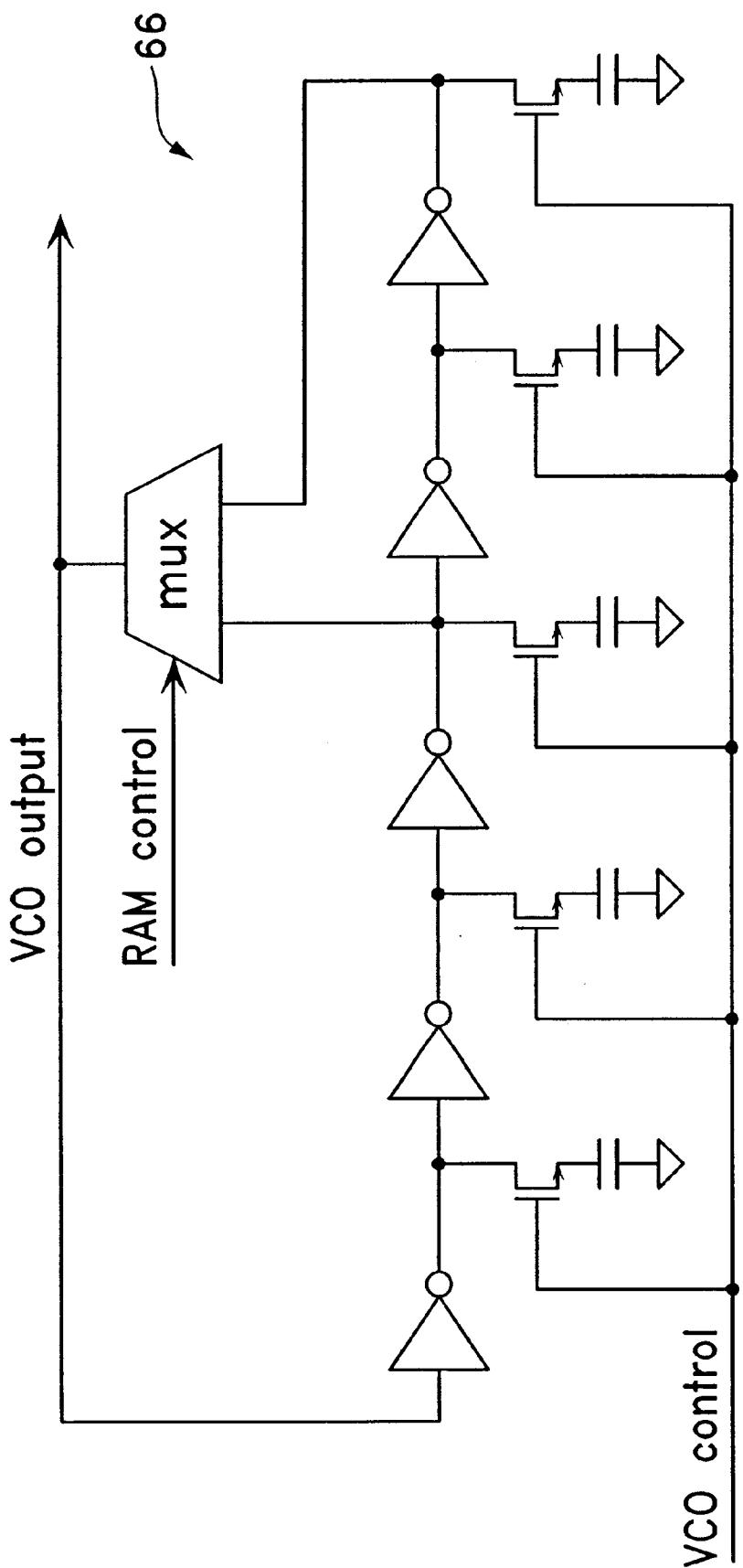
FIG. 6 is an illustrative schematic diagram of a programmable low gain voltage controlled oscillator used in the PLL of FIG. 3.

In FIG. 6, there is shown a schematic diagram of a programmable low gain VCO 66 used in the PLL 62. It is implemented with a variable capacitative load that is driven by a special inverter cell. Since a PLD typically can be configured for a specific frequency, a wide range of VCO settings from 10 MHz to 100 MHz can be chosen without the requirement of having a high gain VCO. Low gain VCOs tend to have a very narrow frequency ranges. This is can be overcome in a PLD implementation by making multiple VCO settings under SRAM bit control.

Delay Element

Figure 7A:
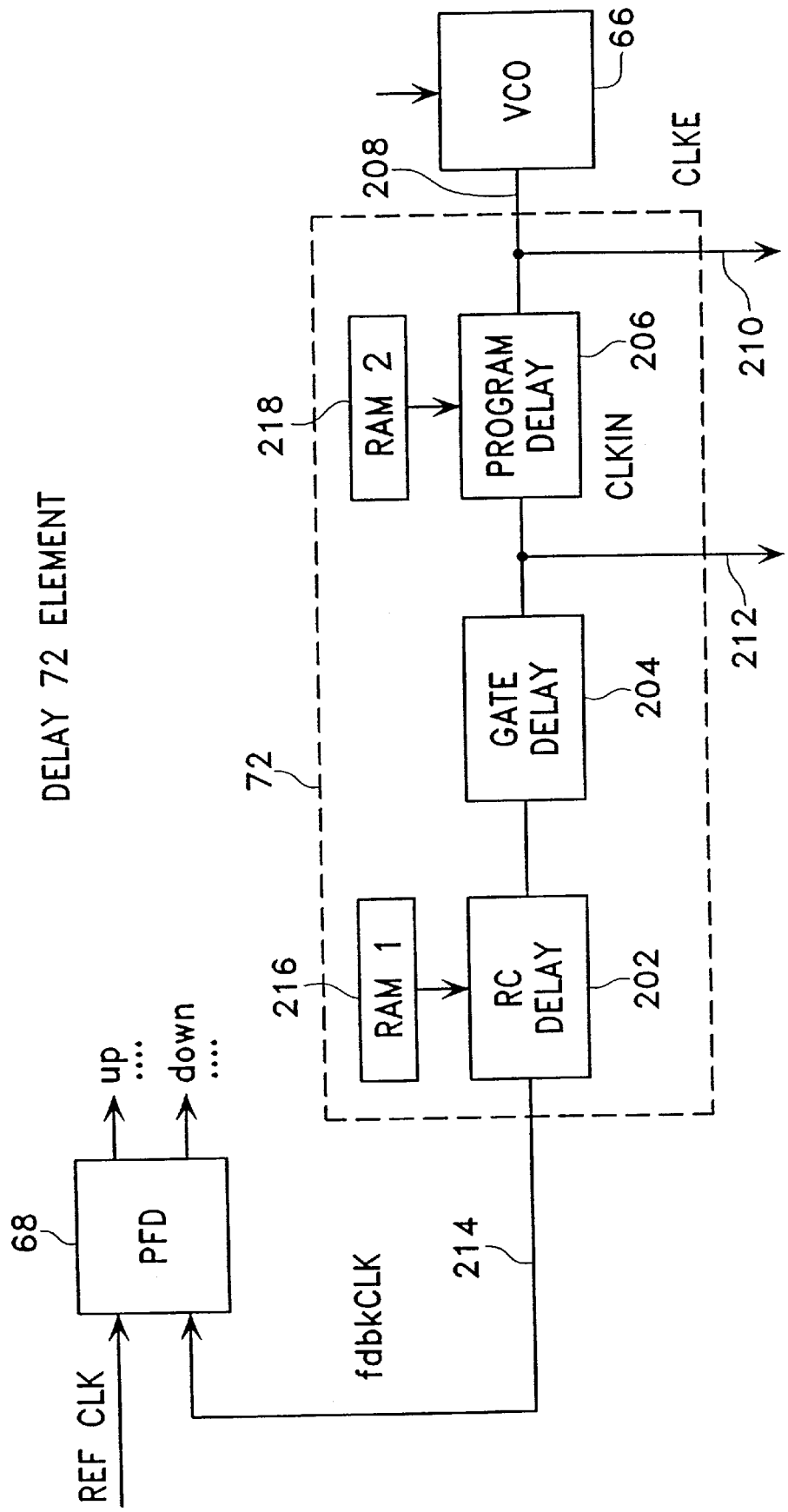
FIG. 7A is a block diagram of a delay element in the feedback path of the PLL of FIG. 3.

Referring to the illustrative drawing of FIG. 7A, there is shown a generalized block diagram of the delay element 72. In a presently preferred embodiment, the delay element 72 includes a clock signal delay compensation circuitry and logic signal delay compensation circuitry as integral components of the PLL feedback. The clock signal delay compensation circuitry includes RC delay elements represented by block 202 and gate delay elements represented by block 204. The logic signal delay compensation circuitry includes programmable delay elements represented by block 206. Input line 208 receives feedback clock signal provided by the VCO 66. A logic signal delay compensated clock signal is provided on line 210. The programmable delay element 206 delays the feedback clock signal by a programmable amount. A clock signal delay compensated signal is provided on line 212. The gate delay element 204 and the RC delay element 206 together further delay the feedback clock signal. In the present embodiment, the clock signal compensation delay circuitry which includes the RC delay and gate delay elements, also is programmable. A feedback clock signal which is in-phase with the reference clock signal (provided the divide-by-two circuit 74 is inactive) is output by the delay element on line 214.

The clock signal delay compensated clock signal on line 212 is earlier (or leads) the in-phase clock signal on line 214 by the delay imparted by RC delay element 202 and gate delay element 206. This delay compensates for delays in the clock network. The clock signal delay compensation circuitry imparts to feedback signals that propagate through it a delay substantially the same as the delay experienced by a clock signal that is conducted through the entire actual clock network. The clock signal delay compensation circuitry may be implemented as a serpentine structure which models the actual clock distribution network in the PLD. Such clock signal delay compensation circuitry may include RC delay elements and logic gates that are the same as or equivalent to corresponding delay elements and gate elements in the actual clock distribution network. Alternatively, the clock signal delay compensation circuitry may comprise a copy of the actual clock distribution network that follows the actual clock network around the PLD in order to accurately model the actual clock signal delay. In yet another alternative, the clock signal delay compensation circuitry may comprise a copy of the actual clock distribution network which follows the actual clock network only half way around the PLD and then doubles back and parallels the same path back to the PLL 62. This second alternative is possible because of the highly symmetrical design of many PLD devices. What is important is that the clock signal delay compensation circuitry is produced with RC delay and logic gate elements that track the performance of corresponding components of the actual clock network over variations in temperature, process and voltage.

Figure 1:
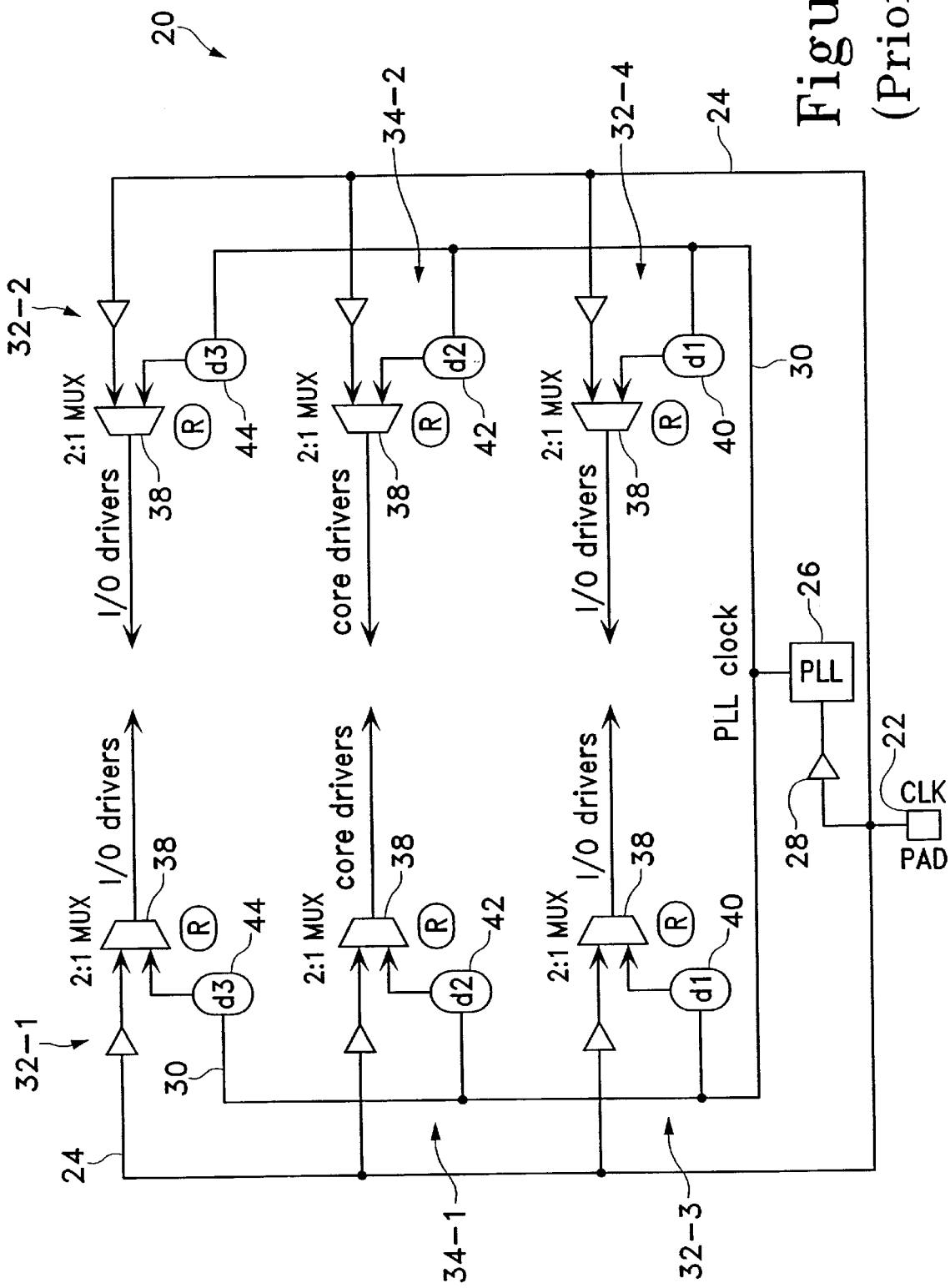
FIG. 1 is a generalized schematic block diagram of a clock distribution network in an earlier programmable logic device.

In each of these implementations, the RC delay element 202 and the gate delay element 204 generally will be implemented in a distributed manner. For instance, the RC delay element 202 represents collectively the wire lengths and parasitic capacitances in a serpentine structure or in a copy of the actual clock distribution network. Also, for example, the gate delay element 204 represents collectively whatever logic gates are employed in conjunction with a serpentine structure or a copy of the actual distribution network. The programming storage cell 216, which is implemented as a digital electronic storage device, can program the clock signal delay compensation circuitry to fine tune the amount of delay imparted. As a result of the clock signal delay compensation, the clock signal delay compensated signal on line 212 will arrive at its destination registers throughout the PLD substantially in phase with the reference clock signal on line 64, although local delay compensation may be required as explained with reference to FIG. 1.

The logic signal delay compensated clock signal on line 210 is earlier (or leads) the clock signal delay compensated clock signal on line 212 by the delay imparted by the programmable delay element 206. This delay compensates for prescribed logic signal delays between registers or other storage elements in the PLD. The prescribed logic signal delay, for instance, may constitute critical path delay. The programmable logic element 206 may be implemented as a chain of inverters or multiplexers in which the programming storage cell 218, which is implemented as a digital electronic storage device, programs the delay element 206 to exhibit a prescribed amount of delay. For instance, the programmable delay element 206 may be implemented so as to be programmable to impart any of a number of discrete delay increments, such as 1 ns increments for instance. Alternatively, the programmable delay element may be implemented as a copy of the particular combinational logic gates or wire delay responsible for the prescribed logic signal delay that is to be compensated for, (e.g. an adder).

Figure 7B:
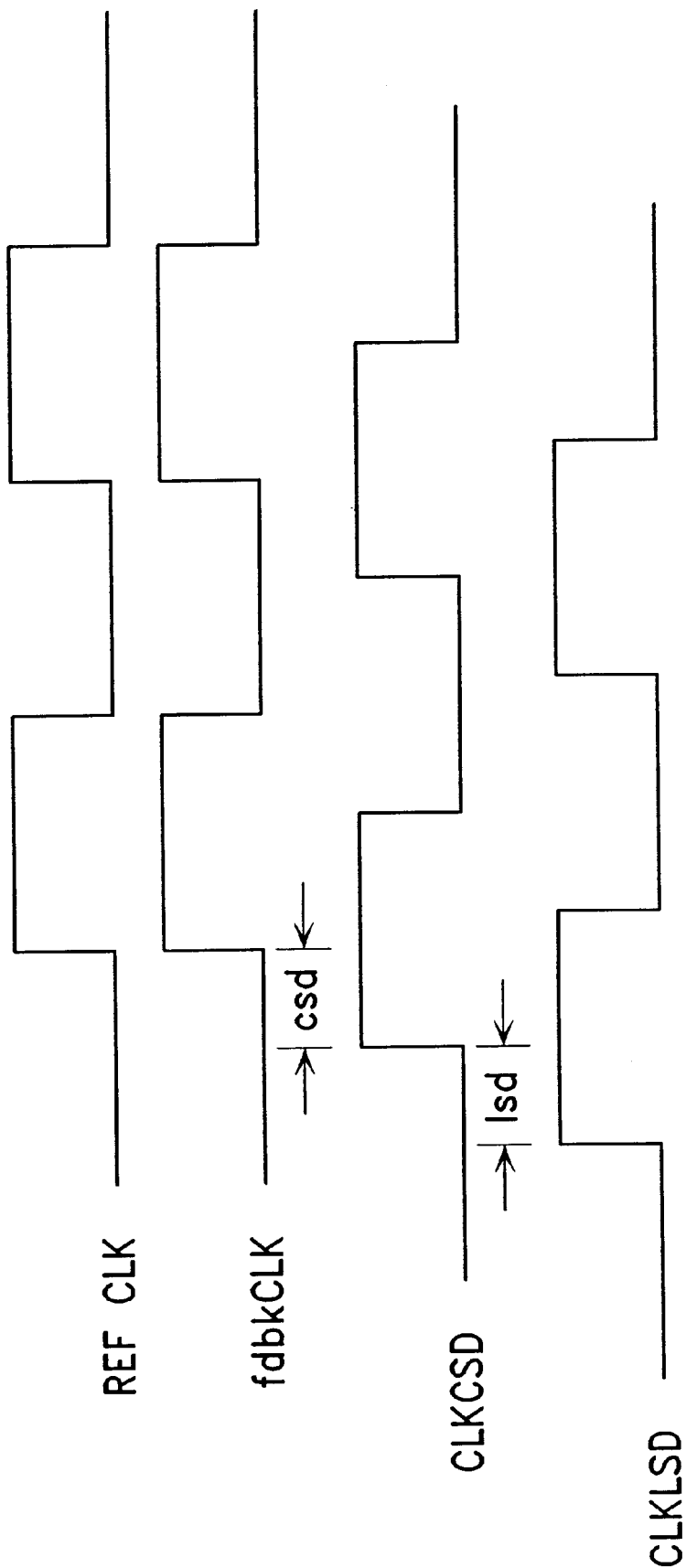
FIG. 7B is a timing diagram illustrating the phase offsets between signals output by the delay element of FIG. 7A.

FIG. 7B is a timing diagram that illustrates the phase relationships between the clock signals on lines 210 and 212 and a feedback clock signal on line 214. Both of the signals on lines 210 and 212 are earlier than the in-phase (the divide-by-two circuit is omitted in FIG. 7A) feedback clock signal on line 214 by an amount that at least compensates for delay in the clock distribution network. Moreover, the logic signal delay compensated clock signal on line 210 is earlier than the clock signal delay compensated signal on line 212 by an amount that is programmable to compensate for logic signal delays in the PLD's logic.

In this example illustrated in FIG. 7B, the three PLL-generated clock signals and the external reference signal have the same frequency. The in-phase feedback clock signal (fdbkCLK) is in phase with an externally generated reference clock signal (REFCLK). The clock signal delay compensated clock signal (CLKCSD) leads the in-phase feedback clock signal (fdbkCLK) by an amount "csd", the delay due to the clock signal delay (csd) in the clock distribution network. The logic signal delay compensation clock signal (CLKLSD) 210 leads the CLKCSD 212 signal by an amount "lsd", the prescribed logic signal delay (lsd).

Thus, clock signal CLKCSD is provided early enough so that, taking into account the clock signal distribution network delay, CLKCSD will be substantially in-phase with clock signal REF CLK by the time CLKCSD arrives at its on-chip destination, subject to some local delay compensation, and clock signal CLKLSD is provided even earlier to compensate for a prescribed logic signal delay.

Clock Multiplication

As shown in FIG. 3, the PLL 62 can generate a on-chip 2×-clock that is matched in phase with the 1×-input clock. This is done by enabling a divide-by-two circuit 74 which can be optionally connected after the delay network 72. Also, the delay network 72 is programmably modified to subtract the delay out of the delay network so as to correct for the tco of the divide-by-two circuit. When operating in the 2× mode, the VCO 66 oscillates at twice the frequency of the input clock and is divided down to match the phase and the frequency of the input clock. This feature has usefulness in that it can relieve some of the constraints in PC board design by allowing a board designer to operate at half the frequency of the 2×-PLL clock. This feature also has usefulness, for example, in that it allows for Time Division Multiplexing (TDM) to be implemented on-chip.

Referring to the illustrative drawings of FIGS. 8A and 8B, and 8C there are exemplary timing diagrams showing 1× clock signals (FIG. 8A) and 2× clock signals (FIG. 8B). FIG. 8A illustrates an exemplary externally generated clock pulse train (fdbkCLK) received on the CLK pad 64. FIG. 8A also shows a clock pulse train at the same frequency as the external clock (i.e., 1× the external clock) generated on-chip by the PLL in response to the external clock. The PLL-generated clock signal achieves phase lock with the external clock, i.e. becomes in-phase with the external clock. During the time interval on the left side of the timing diagram of FIG. 8A, the external clock is not yet in phase with the PLL-generated feedback clock. During the lock time interval the external clock and the PLL-generated feedback clock achieve phase lock. During the time interval on the right side of the timing diagram of FIG. 8A, the external clock and the PLL-generated feedback clock are in phase.

FIG. 8B illustrates an on-chip PLL-generated feedback clock pulse signal train (fdbkCLK) at a frequency that is twice (i.e., 2× the external clock) the frequency of an external clock pulse signal train received on the CLK pad 64. The PLL-generated feedback clock signal achieves a prescribed phase and frequency relationship to the external clock. In this example, the PLL 62 uses the divide-by-two circuit 74 to double the frequency. During the time interval on the left side of the timing diagram of FIG. 8B the external clock and the PLL-generated feedback clock are not yet in the prescribed phase and frequency relationship to each other. During the lock time interval the external clock and the PLL-generated feedback clock achieve prescribed phase and frequency relationship. During the time interval on the right side of the timing diagram of FIG. 8B, the external clock and the PLL-generated feedback clock are in the prescribed phase and frequency (2×) relationship.

FIGS. 8A and 8B only show clock signals at 1× and 2× the reference. However, clock signals at other rates can be produced consistent with the invention, for example, by modifying the divider circuit.

Logic Array Block

Figure 9:
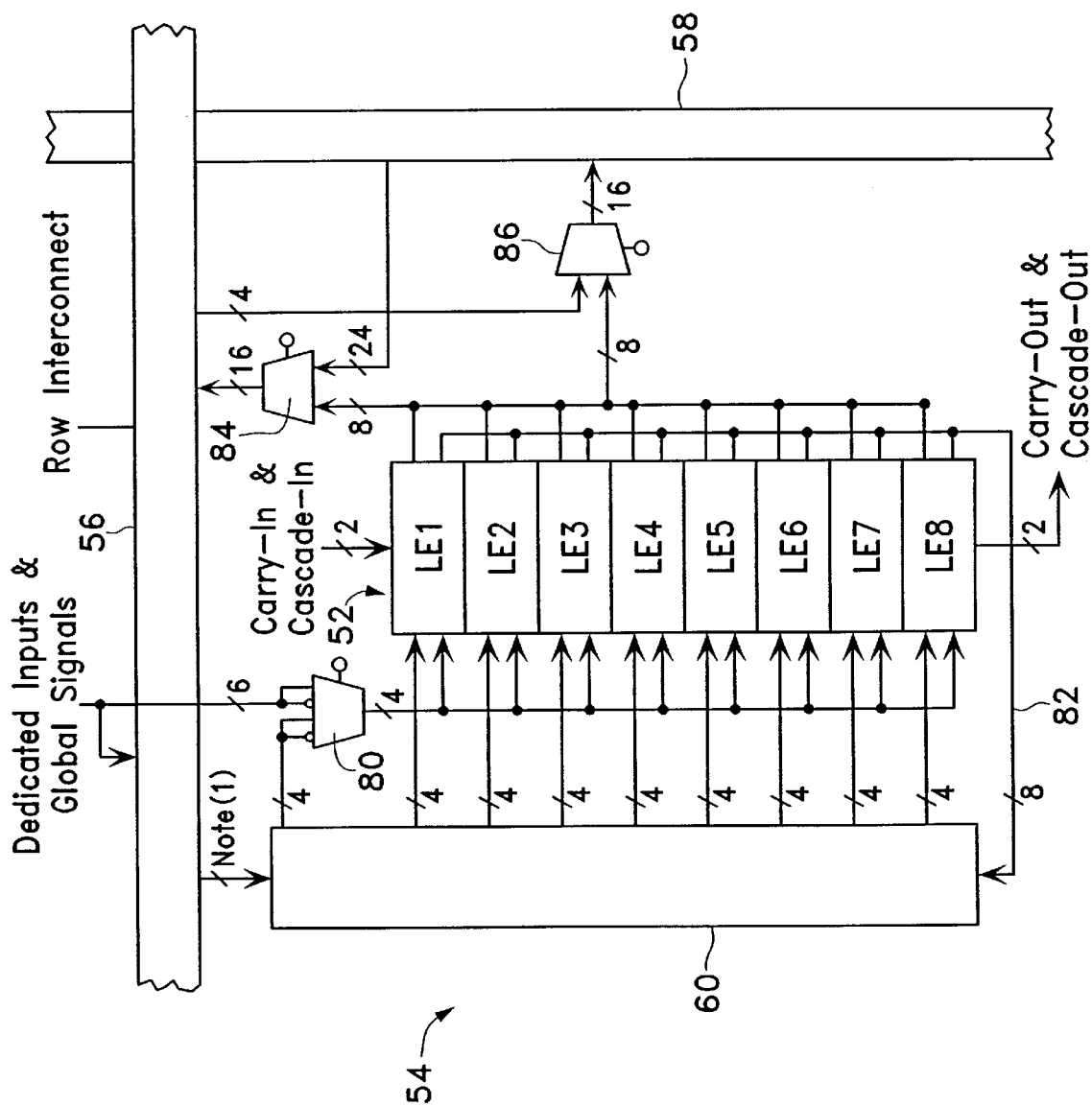
FIG. 9 is an illustrative block diagram of an exemplary logic array block of the programmable logic device of FIG. 2.

Referring to FIG. 9, there is shown an illustrative block diagram of an exemplary logic array block LAB 54 of the programmable logic device 50 of a presently preferred embodiment of the invention. The illustrated LAB 54 is disposed adjacent to one of the global horizontal (row interconnect) conductors 56 and also is disposed adjacent to global vertical (column interconnect) conductors 58. The LAB 54 includes eight programmable logic elements 52, labeled LE1–LE8. The LAB 54 also includes local interface conductors 60 which are programmable to conduct signals between the global horizontal conductors 56 and the logic elements 52. In a current embodiment, each logic element 52 is programmable to receive up to four signals from the local interface 60.

A programmable multiplexer circuit 80 provides control signals used by the programmable logic elements 52. For example, in a present embodiment it can receive dedicated clock signals, global signals, I/O signals and local LAB, and the multiplexer 80, which serves as part of the clock distribution network, can output two clock signals and two clear/preset signals. These are referred to herein as LABCTRL signals. Each logic element 52 is programmable to receive one or more of the signals output by the multiplexer 80.

The logic elements 52 provide outputs which are fed back on lines 82 to the local interface 60 so that, if desired, they can be programmably applied as input to one or more of the logic elements 52. The outputs of the logic elements 52 also are provided to programmable multiplexer 84 and to programmable multiplexer 86. In a current embodiment, the multiplexer 84 is connected to receive as input up to twenty-four signals provided on the adjacent global vertical conductors 58 as well as up to eight signals output by the logic elements 52, and is programmable to output up to sixteen of these inputs to the adjacent global horizontal conductors 56. The multiplexer 86 is connected to receive as input up to four signals provided on the adjacent global horizontal interconnect conductors 56 as well as up to eight signals output by the logic elements 52, and is programmable to output up to sixteen of these inputs to the adjacent global vertical interconnect conductors 58. The logic elements 52 also provide carry-in/carry-out conductors and cascade-in/cascade-out conductors which form no part of the present invention and need not be described in detail herein.

Programmable Logic Element

Figure 10:
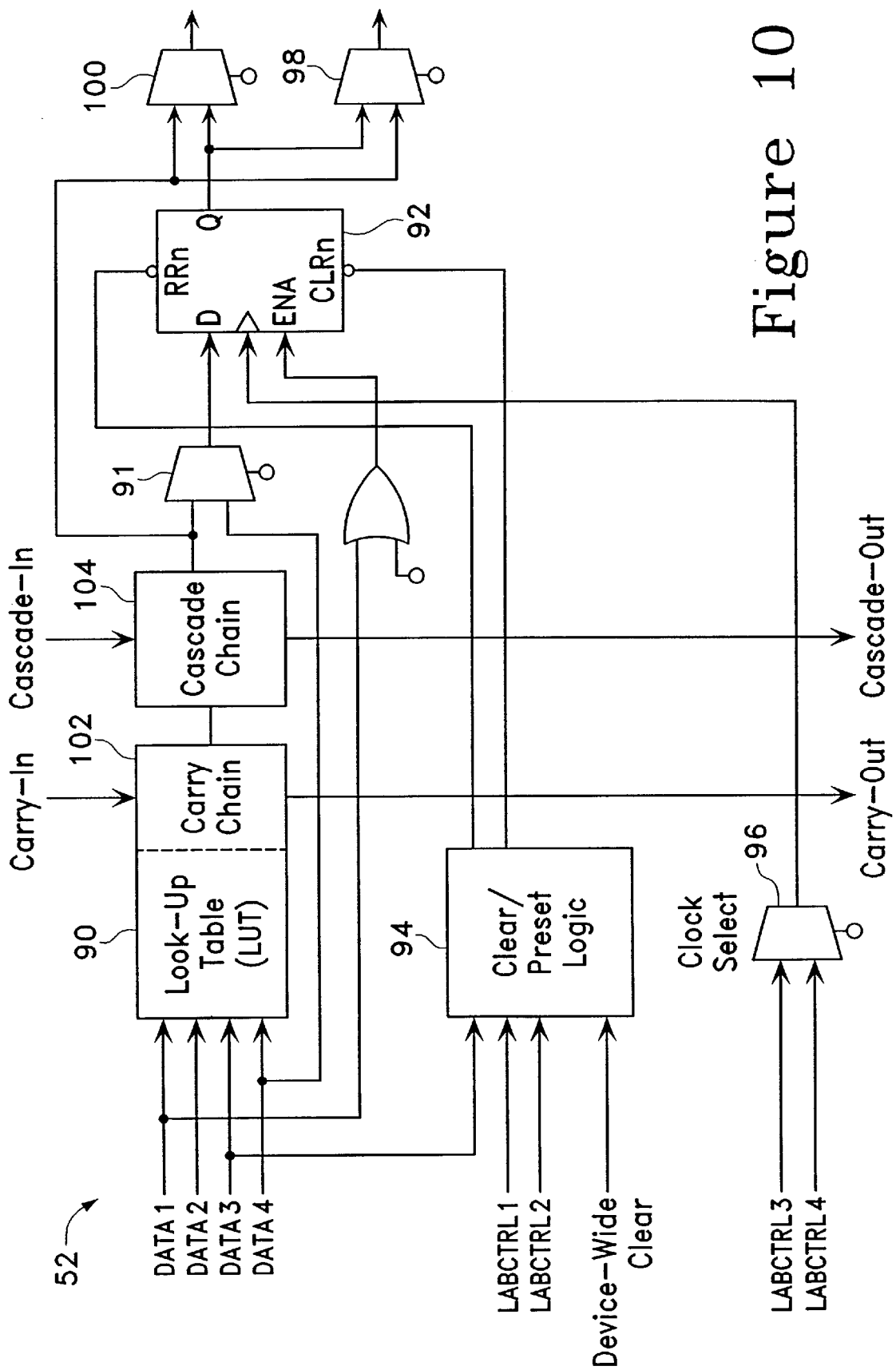
FIG. 10 is an illustrative block diagram of an exemplary programmable logic element of the programmable logic device of FIG. 2.

Referring to FIG. 10, there is shown an illustrative block diagram of an exemplary programmable logic element 52 of the programmable logic device 50 of a presently preferred embodiment of the invention. The illustrated programmable logic element 52 includes logic function unit which produces a logic signal that is a logical function of the input logic signals received by the unit. In the present embodiment, the logic function unit is implemented as a four-input look-up table (LUT) 90 which is a programmable function generator which receives up to four logic input signals (DATA1–DATA4) from the local interface 60 and which provides a logic output signal that is a logical function of the logic input signals. Alternatively, for example, programmable sum-of-products logic can be used instead of a LUT. The logic element also includes a flip-flop 92 which serves as a storage element. The flip-flop 92 in the present preferred embodiment is configured with a synchronous enable input ENA. The flip-flop 92 can be configured for D, T, JK or SR operation. A D flip-flop is implemented in this example. The D input is selected by multiplexer 91. Multiplexer 91 receives as input, the DATA4 signal and an output from a cascade chain block 104. It will be appreciated that the programmable logic element 52 can be programmed so that the output of the LUT90 passes through block 104 and is provided as an input to the multiplexer 91. Clear/preset logic 94 receives LABCTRL 1 & 2 signals output by the programmable multiplexer 80 and receives a PLD-wide clear signal, and provides clear and preset signals to the flip-flop 92. Clock multiplexer 96 receives LABCTRL 3 & 4 signals output by the programmable multiplexer 80 and selects one of these signals and provides it to the clock input of the flip-flop 92. In operation, upon the assertion of an appropriate check pulse on the D flip-flop's clock terminal, the D flip-flop asserts the logic signal value on its D input terminal onto the Q output terminal.

The illustrated programmable logic element 52 includes a programmable multiplexer 98 is connected to receive as input the (unregistered) output of the LUT 90 and to also receive the (registered) output of the flip-flop 92. The multiplexer 98 is programmable to select one of these two inputs for provision as feedback to the local interface 60. Similarly, multiplexer 100 is connected to receive as input the (unregistered) output of the LUT 90 and to also receive the (registered) output of the flip-flop 92. The multiplexer 100 is programmable to select one of these two inputs which can be programmably provided to the adjacent global horizontal or vertical conductors 56 or 58.

The illustrated programmable logic element 52 also includes carry-chain logic 102 and cascade-chain logic 104. The carry-chain supports high-speed counters and adders. The cascade-chain supports wide-input functions with minimal delay. The carry and cascade chains can be programmed to connect all LEs in a LAB and all LABs in the same row. The carry and cascade chains form no part of the present invention and are not described in further detail.

Example of a PLD Programmed in Accordance with the Invention

Figure 11:
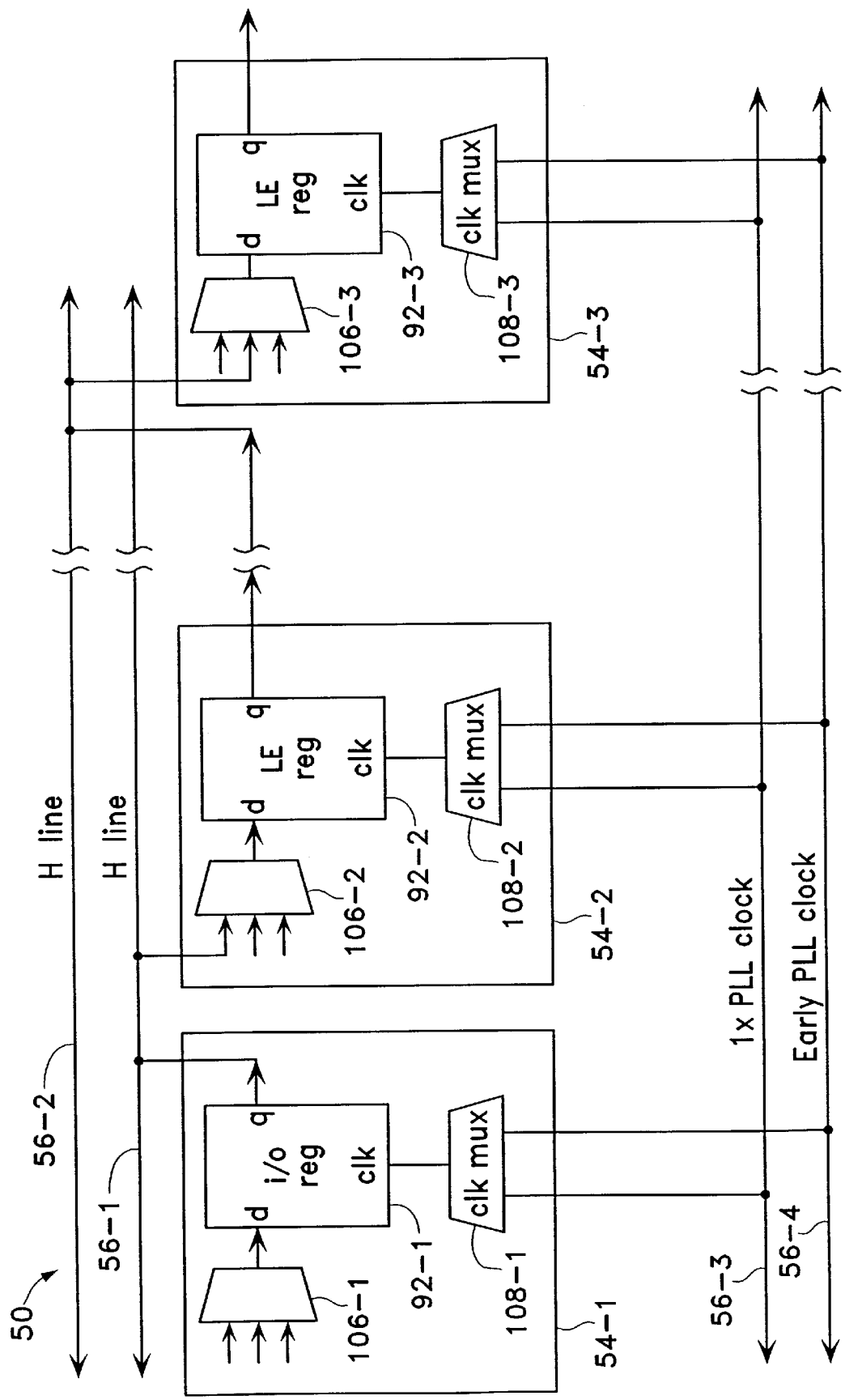
FIG. 11 is an illustrative very simplified block diagram of the programmable logic device of FIG. 2 in which several logic array blocks have been programmed to be interconnected so that output logic signals provided by one block are received as input logic signals by another block.

The advantages of the present invention will be better appreciated by the example illustrated in FIG. 11. The illustrative drawings of FIG. 11 show a very simplified block diagram of the programmable logic device 50 of the presently preferred embodiment which has been programmed such that several logic array blocks 54-1, 54-2 and 54-3 are operably interconnected so that, in response to clock signals and appropriate control signals, output logic signals provided by one block are received as input logic signals by another block. Moreover, it will be assumed for the purposes of this example that the register delay (the propagation delay from the output of one register to the input of the next register) is relatively short from storage element 92-1 to 92-2 but is significantly longer from storage element 92-2 to 92-3. The longer delay from the time when an output logic signal is provided by storage element 92-2 to the time when an input logic signal is received by storage element 92-3, for example, may be due to a longer distance or signal path between storage elements 92-2 and 92-3 than the distance or signal path between storage elements 92-1 and 92-2. Alternatively, the delay may be due to additional combinational logic delays between storage elements 92-2 and 92-3.

In this simplified drawing, respective logic element combinational logic circuits 106-1, 106-2 and 106-3 represent respective programmed combinational logic, such as look-up tables for example, of at least one logic element of each of logic array blocks 54-1, 54-2 and 54-3. Similarly, the respective storage elements 92-1, 92-2 and 92-3 represent respective programmed storage elements, such as flip-flops, of at least one logic element of each of logic array blocks 54-1, 54-2 and 54-3. Lines 56-1, 56-2, 56-3 and 56-4 represent four global horizontal conductors of the PLD 50 which serve as part of the clock distribution network. The clock multiplexers 108-1, 108-2 and 108-3 also serve as part of the clock distribution network. These multiplexers receive on respective conductors 56-3 and 56-4 a clock signal delay compensated clock signal, and a logic signal delay compensated clock signal (which also is clock signal delay compensated as well). These multiplexers are programmable to connect either the in-phase or the early clock signal to a corresponding storage element.

Referring again to the timing diagram of FIG. 7B, the clock signal delay compensated signal on line 56-3 is labeled CLKCSD and the logic signal delay compensated clock signal on line 564 is labeled CLKLSD.

In a presently preferred embodiment of the invention, the respective clock multiplexers 108-1, 108-2 and 108-3 actually are part of respective logic array blocks 54-1, 54-2 and 54-3. These clock multiplexers can be implemented on a LAB-wide basis as part of each LAB's multiplexer 80. Alternatively, these clock multiplexers can be implemented on an individual LE basis as part of each logic element's (LE's) multiplexers 96.

In this example, the PLD 50 is programmed so that an output logic signal provided by storage element 92-1 of LAB 54-1 is conducted via global horizontal conductor line 56-1 and is provided as an input logic signal to logic element combinational logic circuits 106-2 of LAB 54-2 which produce an internal logic signal which is provided as an input to storage element 92-2 of LAB 54-2. Moreover, the PLD 50 is programmed so that an output logic signal provided by storage element 92-2 is conducted via global horizontal conductor 56-2 and is provided as an input logic signal to logic element combinational logic circuits 106-3 of LAB 54-3 which produce an internal logic element signal which is provided as an input to storage element 92-3.

Furthermore, in this example, the PLD 50 is programmed so that the clock multiplexer 108-1 switches the in-phase clock signal to connect with the clk input of storage element 92-1; clock multiplexer 108-2 switches the early clock signal to connect with the clk input of storage element 92-2; and clock multiplexer 108-3 switches the in-phase clock signal to connect with the clk input of storage element 92-3.

It should be noted that in the example illustrated in FIG. 11, the flow of logic signals is from LAB 54-1 to LAB 54-2 and from LAB 54-2 to LAB 54-3. The source of any input logic signals received by LAB 54-1 and the destination of any output logic signals provided by LAB 54-3 are beyond the scope of this illustrative example and shall not be discussed. Moreover, the early clock signal is imparted to the storage element 92-2 of the middle LAB 54-2; while the inphase clock signal is imparted to storage element 92-1 of LAB 54-1 which provides input logic signals to LAB 54-2; and the in-phase clock signal also is imparted to storage element 92-3 of LAB 54-3 which receives the output logic signals provided by LAB 54-2.

The provision of an early (or leading) logic signal compensated clock signal on line 56-4 to the storage element 92-2 in this example advantageously gives the output logic signal provided by storage element 92-2 a head start that can compensate for the additional delay experienced in the logic signal path between storage elements 92-2 and 92-3. The early logic signal compensated clock signal can in effect balance the register logic signal delays between paths with shorter delays and paths with longer logic signal delays by giving a head start to storage elements that provide output logic signals onto a logic signal paths with longer delays.

It will be appreciated that in the preferred embodiment and in this example, both of the two clock signals are generated early enough by the PLL 66 to substantially compensate for clock distribution network delays. This clock signal delay compensation is imparted so that the two clock signals are actually in the desired phase relationship with the external reference. As explained above, some local delay compensation also may be required to achieve such desired phase relationship at all locations throughout the PLD. Thus, both the clock signal delay compensated signal on line 56-3 and the logic signal delay compensated signal on line 56-4 may require local delay compensation as explained above with reference to FIG. 1.

Moreover, it should also be appreciated that logic signal delay compensation can be achieved using two clock signals with the same frequency even if neither of those signals is in phase with an external reference clock as is the case in the disclosed embodiment. For example, as explained with reference to FIG. 12, even if there is no clock signal delay compensation the two clock signals can be provided with a phase difference sufficient to compensate for logic signal delays in accordance with the invention. Also, for example, as explained with reference to FIG. 13, the logic signal delay compensation can be produced locally adjacent to the PLD logic that uses the clock signals rather than being produced directly by the PLL circuitry. Furthermore, for example, logic signal delay compensation can be achieved even if the two clock signals operate at a different frequency than the external reference signal as is the case when the VCO operates in the 2× mode for instance.

First Alternative Embodiment

Figure 12:
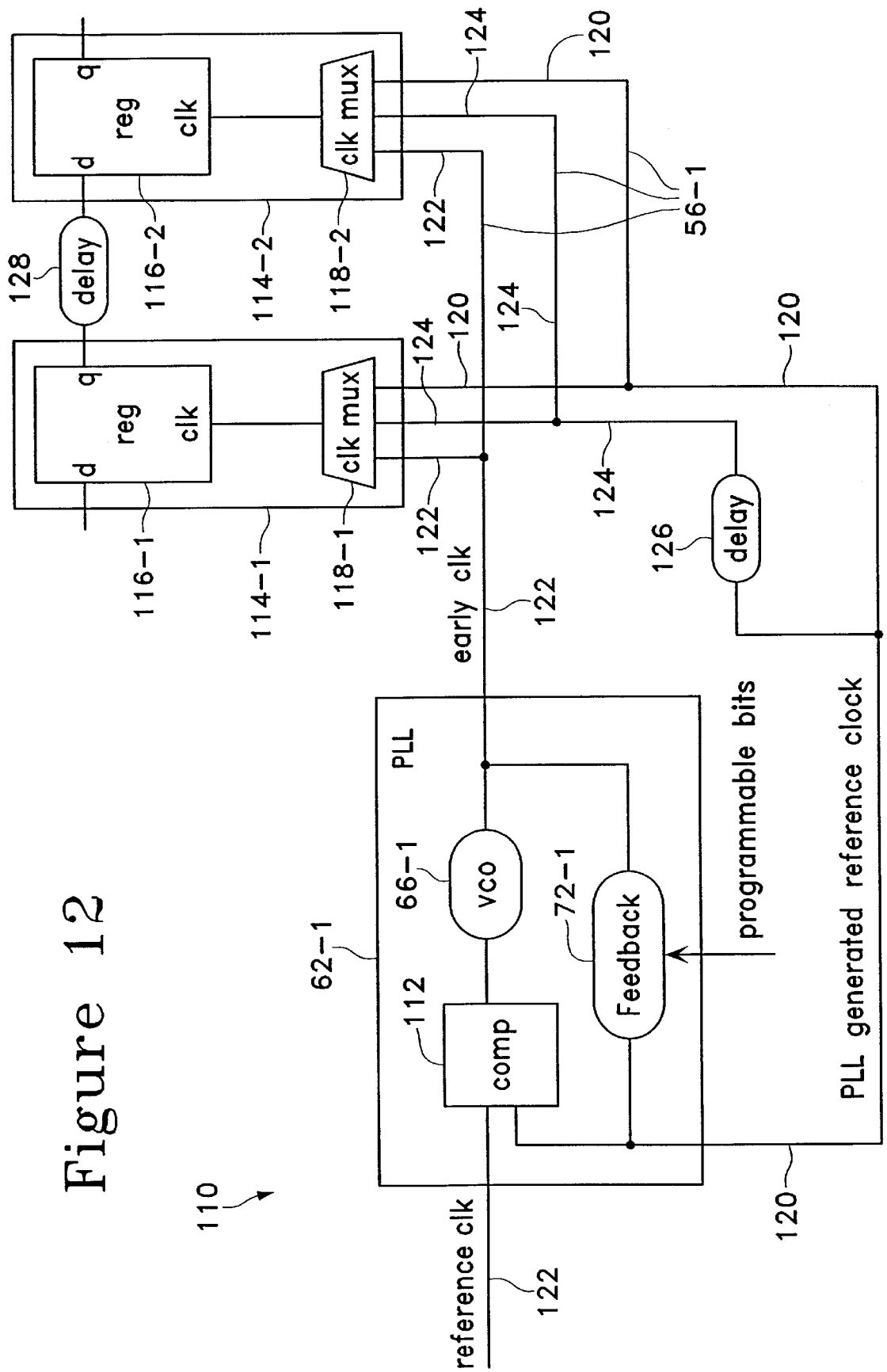
FIG. 12 is an illustrative simplified block diagram of a first alternative programmable logic device in accordance with a first alternative embodiment of the invention.

Referring to the illustrative drawings of FIG. 12 there is shown a simplified block diagram of a first alternative PLD 110 in accordance with a first alternative embodiment of the invention. The first alternative PLD 110 is substantially identical to the PLD 50 described above except for some differences in generation of clock signals. The PLD 110 is described in simplified form so as not to obscure these differences. The PLD 110 includes a phase lock loop (PLL)

circuit 62-1 and a plurality of logic array blocks, although only two logic array blocks 114-1 and 114-2 are shown. The PLL 62-1 is substantially identical to the PLL 62 described with reference to FIG. 3. In this first alternative embodiment, however, the logic signal delay compensation is not provided as part of the delay element 72-1. In order to simplify the drawing, only a VCO 66-1, a delay circuit 72-1 and a comparison circuit 112 (which represents the functions of a PFD, charge pump and LPF) are shown. The LABs 114-1 and 114-2 are illustrated in very simplified form with only a single respective storage element 116-1 and 116-2 and only a single respective clock multiplexer 118-1 and 118-2 shown. It will be appreciated from the discussion above with reference to FIGS. 2, 8 and 9, however, that each LAB in PLD 110 is far more complex with far more components. Moreover, from the discussion with reference to FIG. 11, it will be appreciated that the clock multiplexers 118-1 and 118-2 alternatively may be implemented on a LAB-wide basis or an individual LE basis.

PLL in-phase feedback clock signal is provided on lines 120. A clock signal delay compensated clock is provided on lines 122. In this example, the clock signal delay compensated clock signal has the same frequency as the PLL in phase feedback clock signal but leads or is earlier in phase than the feedback clock signal on lines 120. In a present embodiment, the phase difference between the clock signal on line 122 and the in-phase feedback clock signal on line 120 substantially compensates for clock distribution network delay. A later or lagging clock signal is provided on lines 124. The later clock signal has the same frequency as the clock signal delay compensated clock signal on lines 122, but is delayed by an amount that compensates for certain logic signal delays in the PLD. More specifically, a delay element 126 connected as shown which delays the phase of the PLL feedback clock signal on lines 120 so as to produce the later phase or lagging clock signal on lines 124. In a present embodiment, the delay element 126 offsets the phase of the signal online 126 so as to compensate for an exemplary logic signal delay imparted by logic delay 128. The delay element 126 can be implemented as line delays, RC delays, logic gates, or a combination of RC and gate delays that model the delay 128.

Thus, in this first alternative embodiment, there is a clock signal delay compensated clock on line 122, and there are two clock signals on lines 120 and 124 that are not clock signal delay compensated. However, the clock signal on lines 120 is logic signal delay compensated relative to the delayed clock signal on lines 124. Thus, in this embodiment, the logic signal delay element 126 compensates for logic signal delay by producing a phase offset between the clock signals on lines 120 and 124. Moreover, although the three clock signals on lines 120, 122 and 124 are described as being at the same frequency as the reference clock signal, the first alternative PLD 110 can be implemented with all three clock signals having a frequency that is some multiple of the reference clock signal and with the similar phase offsets between them.

An advantage of the PLD 110 of FIG. 12 is that the effects of certain critical path delays can be limited. For example, LABs 114-1 and 114-2 are operably connected so that, in response to relevant clock signals and control signals, logic signals flow from LAB 114-1 to LAB 114-2. The delay 128, for example, represents register delay due to long path lengths or to combinational logic, for instance. This delay 128 may represent a critical path delay (i.e. the longest delay on the chip). The three clock signals described above are provided on lines 120, 122 and 124 which are part of the collection of the global horizontal conductors 56-1. The PLD 110, for example, can be programmed so that the clock multiplexer 118-1 switches the feedback clock on lines 120 to connect with the storage element 116-1 of LAB 114-1 and so that the clock multiplexer 118-2 switches the lagging clock signal on lines 124 to connect with the storage element 116-2 of LAB 114-2. The delayed clock signal imparted to the storage element 116-2 at the receiving end of the critical path can obviate critical path concerns by allowing more time for logic signals to propagate from the LAB 114-1 to LAB 114-2.

Second Alternative Embodiment

Figure 13:
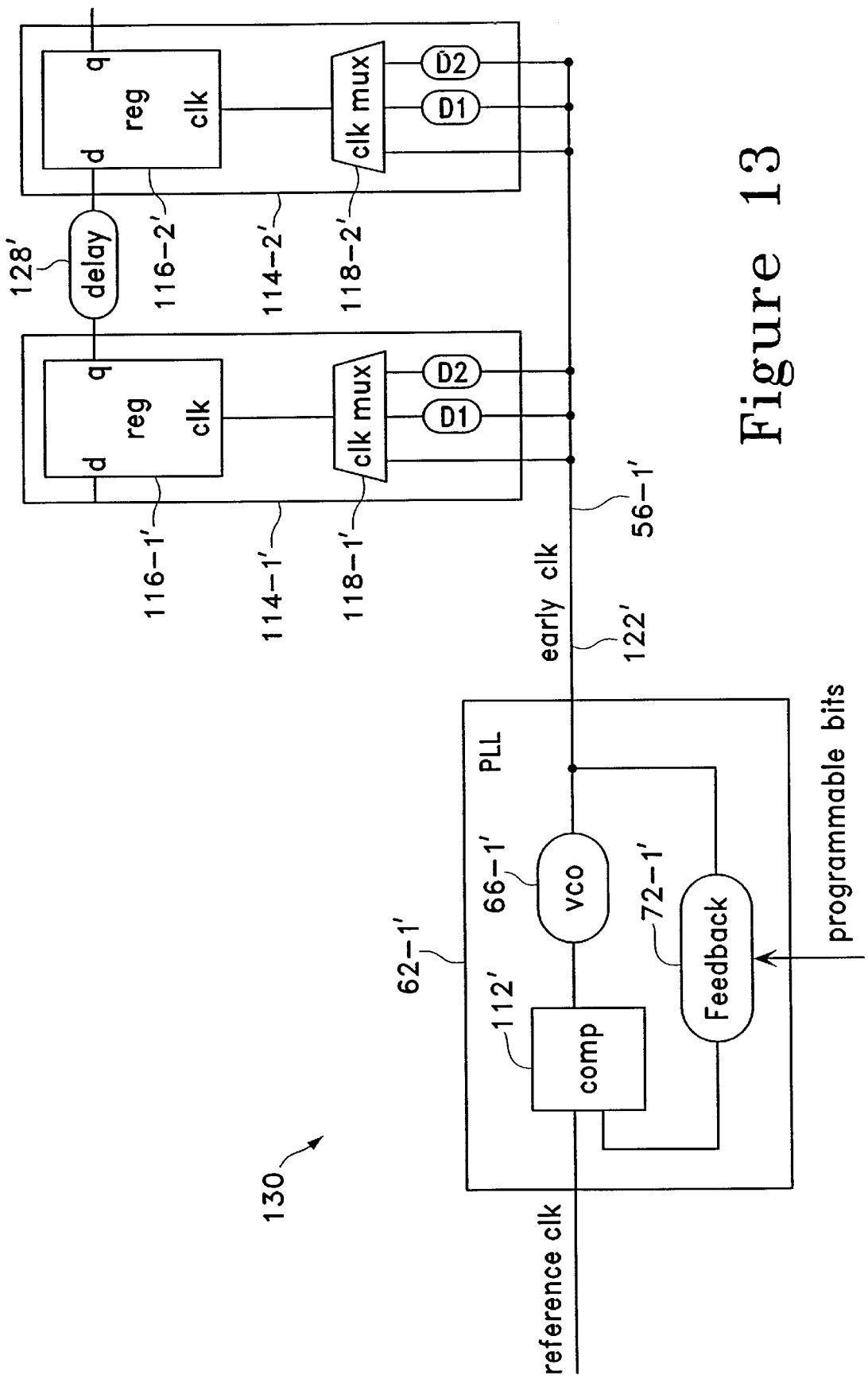
FIG. 13 is an illustrative simplified block diagram of a second alternative programmable logic device in accordance with a second alternative embodiment of the invention.

Referring to the illustrative drawings of FIG. 13 there is shown a simplified block diagram of a second alternative PLD 130 in accordance with a second alternative embodiment of the invention. The PLD 130 of the second alternative embodiment is substantially similar to the PLD 110 of the first alternative embodiment. Although the delay element 72-1 in this embodiment produces clock signal delay compensation but not logic signal delay compensation. Components shown in FIG. 12 are labeled with primed reference numerals identical to the reference numerals used to label like components in FIG. 12. In the second alternative PLD 130, respective local delay elements D1 and D2 are connected as shown to respective clock multiplexers 118-1' and 118-2' of the different respective LABs 114-1' and 114-2'. The delay element 72-1' shifts the phase of the early clock on-line 122' to compensate for clock signal delays. The local delay elements DI and D2 can shift the phase of clock signals on lines 122' to compensate for logic signal delays caused by PLD logic delays such as that represented by delay 128'. Local delay elements D1 and D2 can be implemented as line delays, RC delays, logic delays or a combination of RC and logic delays. Moreover, these local delay elements can be implemented as programmable delay elements. An advantage of this second alternative embodiment is that different amounts of logic signal delay compensation can be applied to different parts (e.g. logic elements or LABs) of the PLD.

While particular embodiments of the invention have been described in detail, various modifications to the preferred embodiments can be made without departing from the spirit and scope of the invention. Thus, the invention is limited only by the appended claims.

What is claimed is:

1. An integrated circuit device comprising:
    a clock signal generator which produces a first clock signal;
    an array of respective programmable logic elements which respectively include multiple logic inputs and at least one logic output and which produce at least one logic output signal from one or more logic input signals received at one or more of the multiple logic inputs and wherein respective programmable logic elements include respective storage elements which can temporarily store logic signals and which are responsive to clock signals;
    a network of logic signal conductors for programmably connecting respective logic outputs of respective programmable logic elements with respective logic inputs of respective programmable logic elements;

a network of clock signal conductors which distributes the first clock signal to respective programmable logic elements;

a plurality of respective first phase shift elements which respectively are disposed locally within the array of respective programmable logic elements and which receive the first clock signal and which provide respective second clock signals which are respective phase-shifted versions of the first clock signal, shifted in phase by an amount which compensates for prescribed delay in logic signal transmission between storage elements; and a plurality of respective programmable connection circuits, each respectively programmable to provide a respective storage element with at least one of the first clock signal or a respective second clock signal.

2. The integrated circuit of claim 1 wherein the clock signal generator includes a phase lock loop.

3. The integrated circuit of claim 1 wherein respective storage elements include respective register circuits.

4. The integrated circuit of claim 1 further including:

a second phase shifting element which shifts the phase of the first clock signal by an amount that substantially compensates for delay in the network of clock signal conductors;

whereby the at least one of the first clock signal or a respective second clock signal programmably provided by the programmable connection circuits are phase shifted to substantially compensate for delay in the network of clock signal conductors.

5. The integrated circuit of claim 1 wherein the clock signal generator includes a phase lock loop (PLL);

a second phase shifting element connects in a feedback of the PLL which shifts the phase of the first clock signal by an amount that substantially compensates for delay in the network of clock signal conductors;

whereby the at least one of the first clock signal or a respective second clock signal programmably provided by the programmable connection circuits are phase shifted to substantially compensate for delay in the network of clock signal conductors.

6. A method of propagating signals in an integrated circuit programmable logic device which includes a plurality of respective programmable logic elements which respectively include multiple logic inputs and at least one logic output and which produce at least one logic output signal from one or more logic input signals received at one or more of the multiple logic inputs, wherein respective programmable logic elements include respective programmable connection circuits for distributing clock signals to respective storage elements of the respective programmable logic elements, and wherein respective storage elements can temporarily store logic signals and are responsive to clock signals, the method comprising:

programming respective programmable logic elements such that a logic output of at least one respective programmable logic element is operably connected to a logic input of another respective programmable logic element;

providing a first clock signal;

providing a second clock signal which is a phase-shifted version of the first clock signal, shifted in phase by an amount which compensates for prescribed delay in logic signal transmission between storage elements;

distributing each of the first and second clock signals to the respective programmable logic elements;

programming respective connection circuits of the respective programmable logic elements to provide respective storage elements of the respective programmable logic elements with one or another of the first and second clock signals; and clocking the respective storage elements with respective received clock signals; and whereby logic signals are conducted between respective operably connected programmable logic elements.

7. The method of claim 6 wherein providing the second clock signal involves programming a programmable phase shift element.

8. The method of claim 6 further including:

imparting a phase shift to the first clock signal and to the second clock signal which substantially compensates for delay in the distributing of the first clock signal.

9. The method of claim 6 further including:

imparting a phase shift to the first clock signal and to the second clock signal which substantially compensates for delay in the distributing of the first clock signal; and imparting further phase shift to the first clock signal and to the second clock signal to compensate for local differences in delay of the first and second clock signals.

10. A method of propagating signals in an integrated circuit programmable logic device which includes a plurality of respective programmable logic elements which respectively include multiple logic inputs and at least one logic output and which produce at least one logic output signal from one or more logic input signals received at one or more of the multiple logic inputs, a logic output of at least one respective programmable logic element being operably connected to a logic input of another respective logic element, wherein respective programmable logic elements include respective storage elements that can temporarily store logic signals and that are responsive to clock signals, the method comprising:

providing a first clock signal;

providing a second clock signal which is a phase-shifted version of the first clock signal, shifted in phase by an amount which compensates for prescribed delay in a logic signal transmission between storage elements;

distributing each of the first and second clock signals among the respective programmable logic elements.

11. The method of claim 10 wherein providing the second clock signal involves programming a programmable phase shift element.

12. The method of claim 10 further including:

imparting a phase shift to the first clock signal and to the second clock signal which substantially compensates for delay in the distributing of the first clock signal.

13. The method of claim 10 further including:

imparting a phase shift to the first clock signal and to the second clock signal which substantially compensates for delay in the distributing of the first clock signal; and imparting further phase shift to the first clock signal and to the second clock signal to compensate for local differences in delay of the first and second clock signals.

14. An integrated circuit programmable logic device comprising a plurality of programmable logic elements including storage elements:

means for providing a first clock signal;

means for providing a second clock signal which is a phase-shifted version of the first clock signal, shifted in phase by an amount which compensates for prescribed delay in a logic signal transmission between storage elements;

means for distributing each of the first and second clock signals among the respective programmable logic elements.

15. The integrated circuit programmable logic device of claim 14 further comprising:

means for imparting a phase shift to the first clock signal and to the second clock signal which substantially compensates for delay in the distributing of the first clock signal.

16. The integrated circuit programmable logic device of claim 14 further comprising:

means for imparting a phase shift to the first clock signal and to the second clock signal which substantially compensates for delay in the distributing of the first clock signal; and means for imparting further phase shift to the first clock signal and to the second clock signal to compensate for local differences in delay of the first and second clock signals.

* * * * *